United States Patent
Liu et al.

(10) Patent No.: US 7,029,980 B2
(45) Date of Patent: Apr. 18, 2006

(54) METHOD OF MANUFACTURING SOI TEMPLATE LAYER

(75) Inventors: Chun-Li Liu, Mesa, AZ (US); Marius K. Orlowski, Austin, TX (US); Matthew W. Stoker, Mesa, AZ (US); Philip J. Tobin, Austin, TX (US); Mariam G. Sadaka, Austin, TX (US); Alexander L. Barr, Austin, TX (US); Bich-Yen Nguyen, Austin, TX (US); Voon-Yew Thean, Austin, TX (US); Shawn G. Thomas, Gilbert, AZ (US); Ted R. White, Austin, TX (US)

(73) Assignee: Freescale Semiconductor Inc., Austin, TX (US)

( * ) Notice: Subject to any disclaimer, the term of this patent is extended or adjusted under 35 U.S.C. 154(b) by 82 days.

(21) Appl. No.: 10/670,928

(22) Filed: Sep. 25, 2003

(65) Prior Publication Data

US 2005/0070056 A1 Mar. 31, 2005

(51) Int. Cl.
*H01L 21/331* (2006.01)
(52) U.S. Cl. .................. 438/311; 438/479; 438/404; 438/459
(58) Field of Classification Search ........... 438/311, 438/404, 459, 479
See application file for complete search history.

(56) References Cited

U.S. PATENT DOCUMENTS

| | | | |
|---|---|---|---|
| 5,461,243 | A | 10/1995 | Ek et al. |
| 5,534,713 | A | 7/1996 | Ismail et al. |
| 5,759,898 | A | 6/1998 | Ek et al. |
| 5,846,857 | A | 12/1998 | Ju |
| 5,943,565 | A | 8/1999 | Ju |
| 5,998,807 | A | 12/1999 | Lustig et al. |

(Continued)

FOREIGN PATENT DOCUMENTS

JP 2000243946 12/1999

(Continued)

OTHER PUBLICATIONS

Chi et al., "Electrically active defects in surface preamorphized and subsequently RTP-annealed Si and the effect of titanium silicidation," *Proc. 1998 5th International Conference on Solid-State and Integrated Circuit Technology,*, Oct. 21, 1998, Beijing, China, p. 324-327.

(Continued)

*Primary Examiner*—Dung A. Le
(74) *Attorney, Agent, or Firm*—David G. Dolezal; James L. Clingan, Jr.

(57) ABSTRACT

A vacancy injecting process for injecting vacancies in template layer material of an SOI substrate. The template layer material has a crystalline structure that includes, in some embodiments, both germanium and silicon atoms. A strained silicon layer is then epitaxially grown on the template layer material with the beneficial effects that straining has on electron and hole mobility. The vacancy injecting process is performed to inject vacancies and germanium atoms into the crystalline structure wherein germanium atoms recombine with the vacancies. One embodiment, a nitridation process is performed to grow a nitride layer on the template layer material and consume silicon in a way that injects vacancies in the crystalline structure while also allowing germanium atoms to recombine with the vacancies. Other examples of a vacancy injecting processes include silicidation processes, oxynitridation processes, oxidation processes with a chloride bearing gas, or inert gas post bake processes subsequent to an oxidation process.

17 Claims, 2 Drawing Sheets

U.S. PATENT DOCUMENTS

| | | | |
|---|---|---|---|
| 6,059,895 A | 5/2000 | Chu et al. | |
| 6,124,627 A | 9/2000 | Rodder et al. | |
| 6,259,138 B1 | 7/2001 | Ohtani et al. | |
| 6,339,232 B1 | 1/2002 | Takagi | |
| 6,369,438 B1 | 4/2002 | Sugiyama et al. | |
| 6,465,316 B1 | 10/2002 | Hattori et al. | |
| 6,524,935 B1 | 2/2003 | Canaperi et al. | |
| 6,562,703 B1 | 5/2003 | Maa et al. | |
| 6,583,437 B1 | 6/2003 | Mizuno et al. | |
| 6,621,131 B1 | 9/2003 | Murthy et al. | |
| 6,638,802 B1 | 10/2003 | Hwang et al. | |
| 6,709,909 B1 | 3/2004 | Mizuno et al. | |
| 6,723,541 B1 | 4/2004 | Sugii et al. | |
| 6,743,651 B1 | 6/2004 | Chu et al. | |
| 6,831,292 B1 | 12/2004 | Currie et al. | |
| 6,833,332 B1 | 12/2004 | Christiansen et al. | |
| 6,855,436 B1 * | 2/2005 | Bedell et al. | 428/641 |
| 6,881,632 B1 | 4/2005 | Fitzgerald et al. | |
| 2001/0048119 A1 | 12/2001 | Mizuno et al. | |
| 2003/0013305 A1 | 1/2003 | Sugii et al. | |
| 2003/0034529 A1 | 2/2003 | Fitzgerald | |
| 2003/0040160 A1 | 2/2003 | Huang et al. | |
| 2004/0175872 A1 | 9/2004 | Yeo et al. | |
| 2004/0242006 A1 | 12/2004 | Bedell et al. | |
| 2004/0259334 A1 | 12/2004 | Bedell et al. | |

FOREIGN PATENT DOCUMENTS

| | | |
|---|---|---|
| WO | WO 2/33746 A1 | 4/2002 |
| WO | WO 02/33746 A1 | 4/2002 |
| WO | WO 02/45156 A2 | 6/2002 |
| WO | WO 0245156 A2 | 6/2002 |

OTHER PUBLICATIONS

Fahey et al., "Point defects and dopant diffusion in silicon," *Reviews of Modern Physics*, Apr. 1989, vol. 61, No. 2, pp. 289-384.

Lee et al., "Sub-30 nm P+ abrupt junction formation in Strained Si/$Si_{1-x}Ge_x$ MOS device," *Technical Digest of the International Electron Devices Meeting*, Dec. 8, 2002, pp. 379-381.

LeGoues et al., "Kinetics and Mechanism of Oxidation of SiGe: Dry Versus Wet Oxidation," *Applied Physics Letters*, Feb. 13, 1989, vol. 54, No. 7, pp. 644-646.

LeGoues et al., "Oxidation Studies of SiGe," *Journal of Applied Physics*, Feb. 15. 1989, vol. 65, No. 4, pp. 1724-1728.

Lim et al., "Dry Thermal Oxidation of a Graded SiGe Layer," *Applied Physics Letter*, Nov. 26, 2001, vol. 79, No. 22, pp. 3606-3608.

Sawano et al., "Relaxation Enhancement of SiGe Thin Layers by Ion Implantation into Si Substrates," *IEEE*, 2002, pp. 403-404.

Tezuka et al., "Dislocation-free Formation of Relaxed SiGe-on-insulator Layers," *Applied Physics Letters*, May 13, 2002, vol. 80, No. 19, pp. 3560-3562.

Tezuka et al., "Fabrication of Strained Si on an Ultrathin SiGe-on-insulator Virtual Substrate with a High-Ge Fraction," *Applied Physics Letters*, Sep. 17, 2001, vol. 79, No. 12, pp. 1798-1800.

Vyatkin et al., "Ion Beam Induced Strain Relaxation in Pseudomorphous Epitaxial SiGe Layers," *IEEE*, 2000, pp. 70-72.

Jung et al., "Implementation of Both High-Hole and Electron Mobility in Strained Si/Strained $Si_{1-y}Ge_y$ on Relaxed $Si_{1-x}Ge_x$ (x<y) Virtual Substrate," *IEEE Electron Device Letters*, vol. 24, No. 7, Jul. 2003, pp. 460-462.

Tezuka et al., "Ultrathin Body SiGe-on-Insulator pMOSFETs with High-Mobility SiGe Surface Channels," *IEEE Transactions on Electron Devices*, vol. 50, No. 5, May 2003, pp. 1328-1333.

Chi et al., "Electrically active defects in surface preamorphized and subsequently RTP-annealed Si and the effect of titanium silicidation," Proc. 1998 5th International Conference on Solid-State and Integrated Circuit Technology, Oct. 21, 1998, Beijing, China, pp. 324-327.

Fahey et al., "Point defects and dopant diffusion in silicon," Reviews of *Modern Physics*, Apr. 1989, vol 61, No. 2, pp. 289-384.

Lee et al., "Sub-30 nm P+abrupt junction formation in Strained Si/Si -,Ge, MOS device," Technical Digest of the International Electron Devices Meeting, Dec. 8, 2002, pp. 379-81.

LeGoues et al., "Kinetics and Mechanism of Oxidation of SiGe: Dry Versus Wet Oxidation,"*Applied Physics Letters*, Feb. 13, 1989, vol. 54, No. 7, pp. 644-646.

LeGoues et al., "Oxidation Studies of SiGe,"*Journal of Applied Physics*, Feb. 15. 1989, vol. 65, No. 4, pp. 1724-1728.

Lim et al., "Dry Thermal Oxidation of a Graded SiGe Layer,"*Applied Physics Letters*, Nov. 26, 2001, vol. 79, No. 22, pp. 3606-3608.

Sawano et al., "Relaxation Enhancement of SiGe Thin Layers by Ion Implantation into Si Substrates," IEEE 2002, pp. 403-404.

Tezuka et al., "Dislocation-free Formation of Relaxed SiGe-on-insulator Layers,"*Applied Physics Letters* , May 13, 2002, vol. 80, No. 19, pp. 3560-3562.

Tezuka et al., "Fabrication of Strained Si on an Ultrathin SiGe-on-iinsulator Virtual Substrates with a High-Ge Fraction, "*Applied Physics Letters*, Sept. 17, 2001, vol 79, No. 12 pp. 1798-1800.

Vyatkin et al., "Ion Beam Induced Strain Relaxation in Pseudomorphous Epilaxial SiGe Layers,"IEEE, 2000, pp. 70-72.

* cited by examiner

METHOD OF MANUFACTURING SOI TEMPLATE LAYER

BACKGROUND OF THE INVENTION

1. Field of the Invention

This invention relates in general to semiconductor circuits and in particular to semiconductor on insulator fabrication.

2. Description of the Related Art

For some applications, it is desirable to produce a layer of strained silicon over an insulator such as with a semiconductor on insulator (SOI) configuration. A strained silicon layer is a layer of silicon whose lattice spacing is larger than a lattice spacing (e.g. 5.43 A) of natural silicon (e.g. relaxed silicon crystal). One example of a strained silicon spacing is 5.4843 A for 1% tensile strain. A strained silicon layer may provide for a greater mobility of electrons and holes than a layer of relaxed silicon crystal.

One method of forming a strained silicon layer is to form a layer of silicon on a template layer having a lattice spacing larger than that of natural silicon crystal. The resultant silicon formed (e.g. by expitaxial deposition) on top of the template layer is stressed to provide a larger lattice spacing.

FIG. 1 shows a prior art wafer 101 in an example of a SOI substrate configuration that includes a silicon germanium (SiGe) layer 103 located on an insulating layer 105 (e.g. silicon dioxide). Insulating layer 105 is located on layer 107.

Referring to FIG. 2, to increase the content of germanium in a template layer and thereby increase its lattice spacing, layer 103 is subject to an oxidation process to enrich the amount of germanium in the bottom portion 205 of layer 103. The top portion is oxidized to form SiO2 layer 203. During the oxidation process, germanium atoms from the top portion of layer 103 are injected into portion 205 and diffuse throughout 205. In one example, the oxidation process involves heating wafer 101 as high as 1200 C in an atmosphere containing oxygen gas with an inert gas (e.g. Argon or $N_2$) as a dilutant.

The resulting $SiO_2$ layer 203 is then removed (e.g. by etching). A layer of silicon is then grown (e.g. epitaxially) on layer 205. Because layer 205 has a larger lattice spacing, the top silicon layer will be under tensile biaxial stress to provide a larger lattice spacing than with naturally occurring silicon crystal.

One problem with this process is that template layer 205 is not fully relaxed in that the lattice spacing does not fully correspond to a crystal having the percentage of germanium that layer 205 has. Accordingly, not all injected germanium atoms are on lattice sites, the layer is stressed by the underlying insulating layer 105, and the interstitial germanium and silicon atoms or layer 205 are prone to form defects.

FIG. 3 shows a two dimensional view of a lattice 301 of silicon germanium crystal having smaller lattice spacing than a relaxed silicon germanium crystal having the same germanium content. Interstitial germanium atoms (e.g. 305) and interstitial silicon atoms (e.g. 311) are shown in FIG. 3 located between lattice sites (e.g. 313 and 315). These interstitial atoms may cause extended defects in the silicon germanium template layer and in a subsequently formed strained silicon layer.

What is needed is an improved method for forming a template layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

It has been discovered that providing a process for injecting vacancies in a layer of template layer material formed over an insulating layer allows for germanium (or other crystal lattice spacing modifying species) atoms to occupy lattice sites of a template layer, thereby increasing the effective lattice spacing of the crystal lattice of the template layer.

Figure 4:
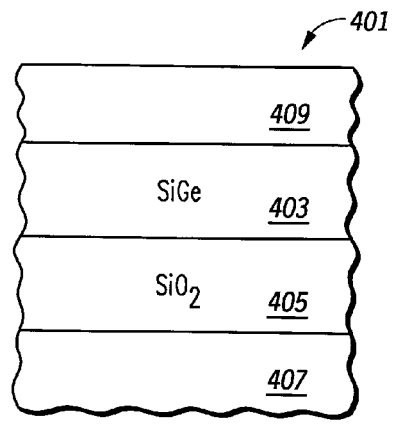
FIG. 4 is partial side view of a wafer during a stage in its manufacture according to one embodiment of the present invention.

FIG. 4 is a partial side view of a wafer after the wafer has been subjected to a nitridation process according to the present invention. Wafer 401 includes an insulating layer 405 made of e.g. silicon oxide located over a layer 407. Layer 407 is made of silicon germanium, but may be made of other materials e.g. poly silicon, mono silicon, amorphous silicon, glass, or quartz. Insulating layer 405 maybe made by forming a silicon germanium layer and then implanting oxygen into the silicon germanium layer followed by annealing to form insulating layer 405. The structure shown in FIG. 4 may also be formed by bonding a second wafer including SiGe to layer 405 and then cutting a portion of the second wafer, leaving a layer of silicon germanium on insulating layer 405. Such a layer of silicon germanium would have a greater thickness than layer 403 as shown in FIG. 4. In other embodiments, insulating layer 405 may extend to the bottom of the wafer.

Layer 409 is a layer of silicon nitride that was grown by subjecting the layer of silicon germanium (not shown) on layer 405 to a nitridation process. In one embodiment, the nitridation process involves flowing ammonia ($NH_3$) over the silicon germanium layer on insulating layer 405 at an elevated temperature. The nitrogen in ammonium reacts with the silicon of the silicon germanium layer to grow the silicon nitride layer 409, thereby reducing the silicon germanium layer to the thickness of silicon germanium layer 403 as shown in FIG. 4. During the nitridation process, vacancies are being injected into the remaining portion (layer 403) of the silicon germanium layer and diffused throughout layer 403. A vacancy is space in a lattice site void of an atom. Also during the nitridation process, germanium atoms from the top portion of the silicon germanium layer are being injected into the remaining portion (layer 403) of the silicon germanium layer. These germanium atoms recombine with the vacancies of layer 403 becoming substitutional. Also interstitial germanium (as well as silicon) atoms recombined with the vacancies becoming substitutional.

Vacancies are injected into layer 403 by the silicon atoms in a lattice of layer 403 propagating upward to combine with the nitrogen of the ammonia to form silicon nitride layer 409. Because the germanium is not reactive with the ammonia, the germanium atoms are injected by diffusion into the lattice of the remaining silicon germanium layer 403.

Figure 5:
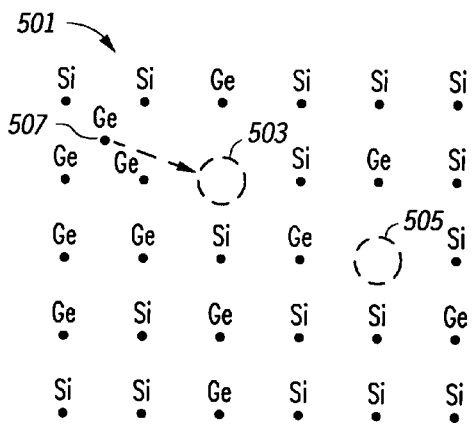
FIG. 5 is a partial two dimensional view of a template layer lattice according to the present invention.

FIG. 5 shows an example of a silicon germanium lattice 501. Lattice 501 includes vacancies 503 and 505. During the nitridation process, germanium atoms (e.g. interstitial germanium atom 507) recombine with vacancies (e.g. 503) to fill the lattice structure.

Referring back to FIG. 4, nitride layer 409 is stripped by an etching selective to silicon germanium layer 403. Layer 403 is used as a template layer for a subsequent application of strained expitaxial silicon layer (see layer 1009 of FIG. 10).

Injecting vacancies into a template layer may render existing interstitial atoms substitutional in the crystal lattice of the template layer. This reduces the number of interstitial atoms in the template layer thereby reducing the defect density of the template layer. Also injecting vacancies into a template layer may allow a reconstruction of the interface between the insulating layer 405 and template layer 403 thereby allowing for a higher degree of relaxation of template layer 403.

In other embodiments, other processes may be utilized for injecting vacancies into template layer material. For example, the layer of silicon germanium template layer material located on layer 405 may be subjected to a silicide process where metal (e.g. titanium) is deposited on the template layer material and reacts (when heated) with the silicon of the template layer material to form a layer of a silicon titanium compound (at the location approximately of layer 409 as shown in FIG. 4). During the silicide process, vacancies are injected into the remaining portion of the silicon germanium template layer material (e.g. layer 403) by the silicon atoms of the remaining portion propagating upward to combine with the titanium to form the titanium silicide layer (e.g. at the location of 409).

In another embodiment, a template layer material maybe subject to an oxynitride process to enrich the germanium in the template layer and to inject vacancies in the template layer. In one example of a oxynitride process, ammonia and oxygen are flowed across the surface of the template layer material to grow a layer of oxynitride from the layer of template layer material. During the oxynitride process, vacancies are injected into the lower portion of the layer of template material by the silicon atoms in that portion propagating upward to combine with the nitrogen of the ammonia and the oxygen to form a silicon oxynitride layer at the location corresponding to layer 409 of FIG. 4. Because the germanium is not reactive with the ammonia and oxygen, the germanium atoms are injected by diffusion into the silicon germanium lattice of the lower portion of the template layer material (located at the location of layer 403 in FIG. 4). The layer of oxynitride is then removed wherein the lower portion (e.g. 403) of the template material is used as the template. In other embodiments, nitric oxide gas (NO) or nitrous oxide gas ($N_2O$) may be flowed across the surface of the template layer material to grow a layer of oxynitride from the layer of template layer material.

In another embodiment, a layer of template material may be subject to an oxidation process where a chloride bearing gas (e.g. hydrogen chloride gas (HCl), chlorine gas ($Cl_2$), carbon tetrachloride gas ($CCl_4$), or trichloroethane gas ($C_2H_3Cl_3$)) is introduced with the oxygen to inject germanium atoms and vacancies into the template layer. In one example of such an oxidation process, HCl and oxygen (and in some embodiment argon or nitrogen ($N_2$) as diluents) are flowed across the layer of template material at 1100 C to grow a layer of silicon oxide on the layer of template material. The silicon oxide layer is located at the location corresponding to layer 403 of FIG. 4. The introduction of Cl is believed to increase the oxidation rate of the oxidation process such that vacancies are injected in the layer of template material.

One further advantage that may occur with the use of an oxidation process with HCl is that the oxidation process may be performed at relatively lower temperatures (e.g. 1050–1100 C in some embodiments) than with a regular oxidation process. Because during an oxidation process, the remaining portion of the layer of template material is enriched with germanium, the melting point of the enriched germanium layer is decreased. Accordingly, the ability to perform oxidation at a lower temperature (1050–1100 C as opposed to 1200 C) allows for the oxidation process to be performed and avoid melting of the layer of template material. Furthermore, the ability to perform oxidation at lower temperatures may make the oxidation process easier to integrate with CMOS processes.

Furthermore, introducing HCl in an oxidation process increases the oxidation rate, thereby decreasing the cycle time needed to perform oxidation. Furthermore, with some embodiments, the HCl does not affect the quality of the grown oxide. Thus, the oxide retains a high selectivity between the oxide and the remaining layer of template material.

In other embodiments, other materials may be utilized as template layer material such as silicon germanium carbon ($Si_{1-x-y}Ge_xC_y$ where Ge content>C content and x>y), Silicon tin (SiSn), Silicon tin germanium (SiSnGe), and germanium carbon (GeC).

Figure 6:
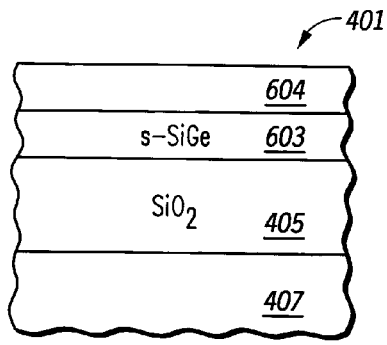
FIG. 6 is partial side view of a wafer during another stage in its manufacture according to one embodiment of the present invention.

In some embodiments, a post condensation step may be applied to the wafer after the removal of the silicon nitride layer 409 (silicon oxynitride or titanium silicide layer in some embodiments). During the oxidation process, silicon of layer 403 propagates upward to combine with the oxygen to grow a silicon oxide layer 604 (see FIG. 6), and thereby consuming a portion of layer 403. Because the germanium is not reactive with oxygen, the germanium atoms are injected by diffusion into the lattice of the remaining portion of layer 403 (layer 603 in FIG. 6). Layer 604 is then etched wherein layer 603 is utilized as a template layer. Layer 603 is more strained that layer 403 due to the post oxidation process. In other embodiments, a post oxidation process may be performed after a silicidation or oxynitride process.

In other embodiments, the performing of a vacancy injecting process may be performed subsequent to a condensation process (e.g. subsequent to the oxidation of the template layer material).

Figure 1:
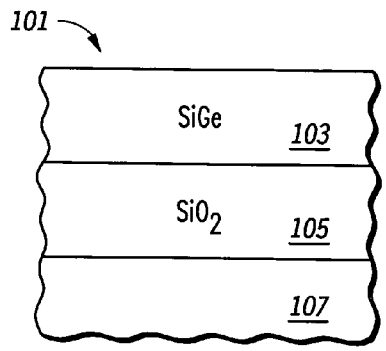
FIG. 1 is a partial side view of a prior art wafer.
Figure 2:
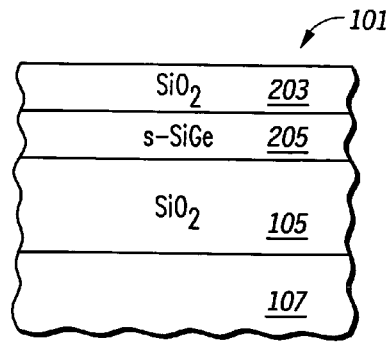
FIG. 2 is a partial side view of a prior art wafer.
Figure 3:
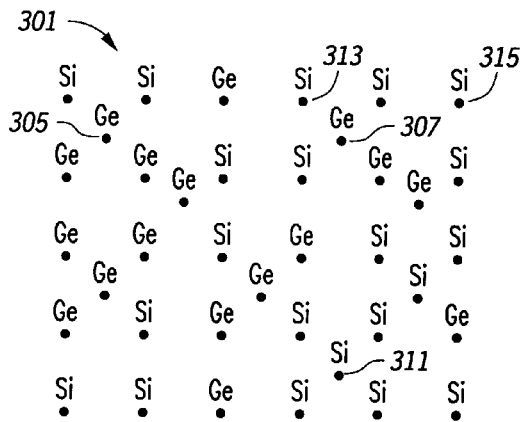
FIG. 3 is a partial two dimensional view of a prior art template layer lattice.
Figure 7:
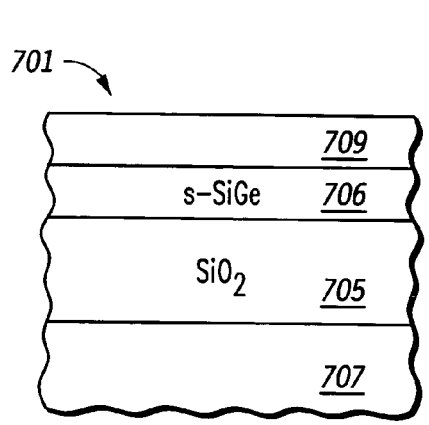
FIG. 7 is partial side view of a wafer during a stage in its manufacture according to another embodiment of the present invention.

FIG. 7 is a partial cross sectional view of a wafer that has been first subjected to an oxidation process and then a nitridation process to inject vacancies into the template layer. Layers 706 and 709 are formed from a nitridation process of a layer of strained silicon germanium (e.g. similar to layer 205 of FIG. 2). The strained silicon germanium layer was formed by an oxidation process where an oxide layer (e.g. 203) was grown on a silicon germanium layer (e.g. 103 of FIG. 1). The resultant strained silicon germanium layer (e.g. layer 205) was germanium rich due the diffusion of germanium atoms into the resultant layer from the consumed portion of the germanium layer. Because the oxidation process is not a vacancy generating process, a portion of the diffused germanium atoms become interstitial in the lattice of the strained silicon germanium layer (e.g. 205). Afterwards, the oxide layer (e.g. 205) is removed. In other embodiments, only a portion of the oxide layer (e.g. 205) is removed.

During a subsequent nitridation process, a silicon nitride layer 709 is grown from the strained silicon germanium layer (e.g. 205). Vacancies are injected into the remaining silicon germanium layer 706 by the silicon atoms in a lattice of layer 706 propagating upward to combine with the nitrogen to form silicon nitride layer 709. These vacancies recombine with the interstitial germanium of the germanium rich strained silicon germanium layer 706 to reduce the number of interstitial germanium. Also, germanium atoms of the consumed portion of the strained silicon germanium (e.g. 205) are injected by diffusion into the lattice of layer 706. Layer 709 is removed and layer 706 is used as a template layer. Because of the injection of vacancies, the resulting layer 706 is less strained than the preceding strained silicon germanium layer (e.g. 205).

Figure 8:
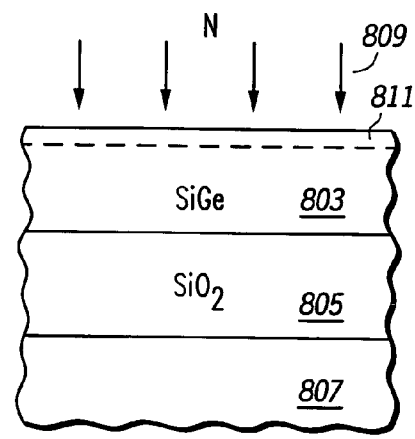
FIG. 8 is partial side view of a wafer during a stage in its manufacture according to another embodiment of the present invention.
Figure 9:
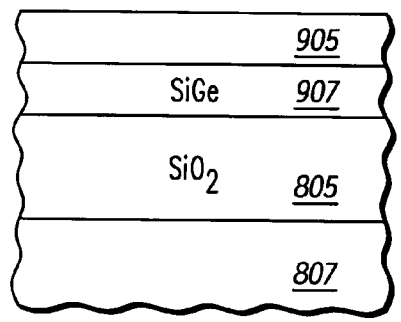
FIG. 9 is partial side view of a wafer during a stage in its manufacture according to another embodiment of the present invention.

FIGS. 8 and 9 show a wafer during stages of another vacancy injecting process. In FIG. 8, nitrogen (809) is implanted into the top portion 811 of a layer of template material 803 (e.g. SiGe) located over insulating layer 805. In some embodiments, the nitrogen is implanted at doses larger than $10^{13}$ atoms/cm2 and at energies between 10–50 keV. Wafer 801 is then subject to an oxidation process wherein a layer of oxynitride 905 is grown, and vacancies and germanium atoms are injected into the lattice of the bottom portion 907 of layer 803 (See FIG. 9). Afterwards, layer 905 is etched where portion 907 serves as the template layer.

In other embodiments, a layer of template material may be subject to an oxidation process and then a subsequent inert gas post bake process. In one embodiment, a hydrogen post bake process is performed at T=900–1100 C for 1–100 min with $H_2$ gas being flowed over the $SiO_2$ layer at a pressure of $PH_2$=1–100 Torr. Vacancies are injected into the remaining layer of template material during the inert gas post bake process. In other embodiments, other inert gases such as argon may be used with low oxygen pressure ($PO_2$).

Figure 10:
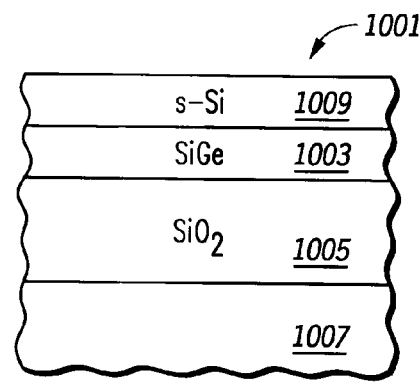
FIG. 10 is partial side view of a wafer during a stage in its manufacture according to one embodiment of the present invention.

Referring to FIG. 10, after the formation of a template layer 1003 over insulating layer 1005 (e.g. by a process similar to any one of the processes described above) a layer of strained silicon 1009 is formed (e.g. epitaxially grown) on template layer 1003. Afterwards, devices such as transistors are formed in strained silicon and template layer. In one embodiment, the channel regions of transistors are formed in the strained silicon layer 1009.

In other embodiments, a layer of monocrystalline silicon is formed on the insulating layer (e.g. 405). A layer of silicon germanium (or other template material) would then be formed on the layer of silicon material. During vacancy injecting processes and oxidation processes (in some embodiments), germanium atoms and vacancies would be injected into the silicon layer wherein the silicon layer would serve as a portion of the template layer.

In one embodiment, a method includes providing a layer having a crystalline structure including silicon atoms and geranium atoms over an insulating layer and performing a vacancy injecting process. The vacancy injecting process injecting germanium atoms and vacancies into the crystalline structure.

In another embodiment, a method includes providing an insulating layer and a semiconductor layer of template layer material having a crystalline structure over the insulating layer. The crystalline structure comprises atoms of a first type. The method also includes performing a vacancy injecting process to inject vacancies into the crystalline structure. The vacancies recombine with atoms including atoms of a second type.

In other embodiment, a method includes providing a semiconductor on insulator (SOI) substrate with a top semiconductor layer having a crystalline structure comprising atoms of a first type and a second type. The method also includes forming material on the crystalline structure using a process that consumes atoms of the first type in a way that injects vacancies into the crystalline structure wherein vacancies recombine with atoms including atoms of the second type. The method further includes forming a second semiconductor layer comprising atoms of the first type on the crystalline structure. The second semiconductor layer being characterized as strained.

In another embodiment, a method includes providing a silicon germanium layer having a crystalline structure over an insulating layer, growing an oxide layer on the crystalline structure, and removing at least a portion of the oxide layer. The method also includes forming a first layer on the crystalline structure, removing the first layer, and forming a silicon layer on the crystalline structure after the removing at least a portion of the oxide layer and the removing the first layer.

In other embodiment, a method includes providing a silicon germanium layer having a crystalline structure over an insulating layer and growing an oxide layer on the crystalline structure with an oxidation process that includes a chloride bearing gas. The method also includes removing the oxide layer and forming a silicon layer on the crystalline structure after the removing the oxide layer.

In another embodiment, a method includes providing a silicon germanium layer having a crystalline structure over an insulating layer and growing an oxide layer on the crystalline structure. The method further includes removing the oxide layer, performing an inert gas post bake after the growing the oxide, and forming a silicon layer on the crystalline structure after the removing the oxide layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
   providing a semiconductor on insulator (SOI) substrate with a top semiconductor layer having a crystalline structure comprising atoms of a first type and a second type;
   forming material on the crystalline structure using a process that consumes atoms of the first type in a way that injects vacancies into the crystalline structure wherein vacancies recombine with atoms including atoms of the second type; and
   forming a second semiconductor layer comprising atoms of the first type on the crystalline structure, the second semiconductor layer being characterized as strained;
   removing the material prior to the forming the second semiconductor layer.

2. The method of claim 1, further comprising:
   growing an oxide on the crystalline structure;
   removing at least a portion of the oxide prior to the forming the second semiconductor layer.

3. The method of claim 1 wherein the growing the oxide and the removing at least a portion of the oxide are performed prior to the forming material on the crystalline structure.

4. The method of claim 1 wherein the growing the oxide and the removing at least a portion of the oxide are performed after to the forming the material on the crystalline structure.

5. The method of claim 1, wherein forming the material comprises growing a nitride layer on the crystalline structure.

6. The method of claim 1, wherein forming the material comprises:
   forming a metal layer that is reactive with atoms of the first type; and
   reacting the metal layer with the crystalline structure to form the material.

7. The method of claim 1, wherein forming the material comprises growing an oxynitride layer on the crystalline structure.

8. The method of claim 1, wherein forming the material comprises:
   implanting nitrogen into the crystalline structure; and
   growing an oxynitride layer on the crystalline structure.

9. The method of claim 1, wherein the first type is silicon and the second type is germanium.

10. The method of claim 1, wherein forming the material comprises growing an oxide layer on the crystalline structure.

11. A method, comprising:
    providing a first semiconductor layer including silicon and geranium and having a crystalline structure over an insulating layer;
    forming an oxynitride layer over the crystalline structure, wherein the forming includes using a process that consumes a portion of the first semiconductor layer;
    removing the oxynitride layer;
    forming a second semiconductor layer including silicon over the crystalline structure after the removing the oxynitride layer.

12. The method of claim 11 wherein the forming the second semiconductor layer includes using the first semiconductor layer as a template.

13. The method of claim 11 wherein the forming an oxynitride layer further includes:
    implanting nitrogen into the first semiconductor layer;
    performing an oxidation process on the first semiconductor layer.

14. The method of claim 11 wherein the forming the oxynitride layer further includes performing an oxynitridation process.

15. The method of claim 11 wherein the oxynitridation process includes flowing at least one of ammonia and oxygen, nitric oxide, and nitrous oxide over the first semiconductor layer.

16. The method of claim 11 wherein the first semiconductor layer is characterized as being relatively more relaxed after the forming the oxynitride layer than before the forming the forming the oxynitride layer.

17. The method of claim 11 wherein the second semiconductor layer is characterized as a strained layer.

* * * * *